United States Patent
Simoyama

(10) Patent No.: US 9,735,296 B2
(45) Date of Patent: Aug. 15, 2017

(54) SEMICONDUCTOR LIGHT RECEIVING DEVICE

(71) Applicants: FUJITSU LIMITED, Kawasaki-shi, Kanagawa (JP); Photonics Electronics Technology Research Association, Bunkyo-ku, Tokyo (JP)

(72) Inventor: Takasi Simoyama, Tsukuba (JP)

(73) Assignees: FUJITSU LIMITED, Kawasaki (JP); PHOTONICS ELECTRONICS TECHNOLOGY RESEARCH ASSOCIATES, Tokyo (JP)

( * ) Notice: Subject to any disclaimer, the term of this patent is extended or adjusted under 35 U.S.C. 154(b) by 0 days.

(21) Appl. No.: 15/284,920

(22) Filed: Oct. 4, 2016

(65) Prior Publication Data

US 2017/0104109 A1    Apr. 13, 2017

(30) Foreign Application Priority Data

Oct. 13, 2015 (JP) .................................. 2015-202027

(51) Int. Cl.
  *G02B 6/12* (2006.01)
  *H01L 31/0232* (2014.01)
  (Continued)

(52) U.S. Cl.
  CPC .... *H01L 31/02327* (2013.01); *G02B 6/12004* (2013.01); *G02B 6/125* (2013.01);
  (Continued)

(58) Field of Classification Search
  None
  See application file for complete search history.

(56) References Cited

U.S. PATENT DOCUMENTS

| 2010/0044818 A1* | 2/2010 | Watanabe ......... H01L 31/02162 257/432 |
| 2012/0235265 A1* | 9/2012 | Takabayashi ......... H01L 31/105 257/432 |

(Continued)

FOREIGN PATENT DOCUMENTS

JP    2014-192472 A1    10/2014

OTHER PUBLICATIONS

T. Yin, et al.; "31GHz Ge n-i-p. waveguide photodetectors on Silicon-on-Insulator substrate;" Optics Express; vol. 15; No. 21; Oct. 17, 2007; pp. 13965-13971 (7 Sheets)/p. 5 of specification.
G. Masini, et al.; "High-Performance p-i-n. Ge on Si Photodetectors for the Near Infrared: From Model to Demonstration;" IEEE Transactions on Electron Devices; vol. 48; No. 6; Jun. 2001; pp. 1092-1096 (5 Sheets)/p. 5 of specification.

*Primary Examiner* — Sung Pak
(74) *Attorney, Agent, or Firm* — Kratz, Quintos & Hanson, LLP

(57) ABSTRACT

A semiconductor light receiving device includes a substrate, a semiconductor fine line waveguide provided on the substrate, and a light receiving circuit that is provided on the substrate and that absorbs light propagating through the semiconductor fine line waveguide. The light receiving circuit includes a p type first semiconductor layer, a number of second semiconductor mesa structures provided on the p type first semiconductor layer in such a manner that an n type second semiconductor layer is provided on top of an i type second semiconductor layer, a p side electrode connected to the p type first semiconductor layer in a location between the second semiconductor mesa structures, and an n side electrode connected to the n type second semiconductor layer. The refractive index and the optical absorption coefficient of the second semiconductor layers are greater than the refractive index and the optical absorption coefficient of the first semiconductor layer.

10 Claims, 20 Drawing Sheets

(51) Int. Cl.
*H01L 31/02* (2006.01)
*H01L 31/0352* (2006.01)
*H01L 31/0224* (2006.01)
*H01L 31/109* (2006.01)
*H01L 31/028* (2006.01)
*G02B 6/125* (2006.01)
*G02B 6/28* (2006.01)

(52) U.S. Cl.
CPC ...... *G02B 6/2813* (2013.01); *H01L 31/02002* (2013.01); *H01L 31/028* (2013.01); *H01L 31/022408* (2013.01); *H01L 31/0352* (2013.01); *H01L 31/109* (2013.01); *G02B 2006/12123* (2013.01); *G02B 2006/12126* (2013.01)

(56) References Cited

U.S. PATENT DOCUMENTS

| | | | | |
|---|---|---|---|---|
| 2015/0286108 | A1* | 10/2015 | Prosyk | G02F 1/225 385/3 |
| 2016/0043262 | A1* | 2/2016 | Okumura | H01L 31/105 257/184 |
| 2016/0105247 | A1* | 4/2016 | Cheng | H01L 31/173 250/551 |
| 2016/0284876 | A1* | 9/2016 | Yagi | H01L 31/02005 |
| 2016/0308075 | A1* | 10/2016 | Wang | H01L 27/1443 |

* cited by examiner

SEMICONDUCTOR LIGHT RECEIVING DEVICE

CROSS-REFERENCE TO RELATED APPLICATION

This application is based upon and claims the benefit of priority of the prior Japanese Patent Application No. 2015-202027, filed on Oct. 13, 2015, the entire contents of which are incorporated herein by reference.

FIELD

The present invention relates to a semiconductor light receiving device, and to a waveguide type semiconductor light receiving device for a large capacity optical interconnect of the next generation where Si fine waveguides and Ge-based light receiving units that are used for high speed optical communication are integrated, for example.

BACKGROUND

As the demand increases for the processing capacity of computers, expansion in the data transmission/reception band between a CPU and a memory or between a number of CPUs has been required. Since data transmission by means of electrical signals is reaching its limitations, the application of optical signals has been required.

At this time, it is necessary to integrate a CPU and light processing components in order to efficiently convert electrical signals within the CPU and the memories to optical signals used for data transmission/reception or vice versa. In response to this issue, research and development in the field that is referred to as silicon photonics (Si-photonics), where various types of optical components are formed on a Si substrate, has been attracting attention.

The part for carrying out a process of optical multiplexing/demultiplexing as well as modulation from among the optical components is required to have such properties as not to absorb light in order to avoid excess loss. Meanwhile, light receiving units (PDs: photodetectors) for converting light to electricity naturally need to have such properties as to absorb light.

What is considered to be a prospective candidate that satisfies this demand is a combination of a Ge material for the light receiving units, an Si material for the remaining portions, and near-infrared rays having a wavelength of 1.2 µm to 1.6 µm that are used as signal light. The Si is transparent for the light of this wavelength range, which is absorbed by the Ge material. Though there are other semiconductor materials that absorb the light of this wavelength range, Ge is a group IV material like Si and has a smaller contamination effect during the manufacturing process as compared to a case where a group III-V compound semiconductor mixed crystal is used, and thus is regarded as the prospective candidate.

Irrelevant of what is used as the material, conventional PDs need a mechanism for taking out electrons and holes that have been generated as a result of light absorption, that is to say, photocarriers, to the outside. Such a mechanism requires an electrode for applying an electrical field to the semiconductor and a band structure distribution for achieving rectification with which electrons and holes are separately taken out. Typically, two types are known as such a mechanism, and they are respectively referred to as an MSM (metal-semiconductor-metal) type PD and a pin type PD.

In the case of an MSM type PD, the metal that forms an electrode has such a structure as to be joined to a semiconductor through a Schottky type interface. This is different from the pin type PD, thereby making it unnecessary to dope the semiconductor portion to which the metal is joined with high concentration impurities, and rectification is achieved by the Schottky barrier in the interface of the junction.

In contrast, in a pin type PD, a band inclination provides rectification in the junction between a p type semiconductor and an n type semiconductor that are formed by injecting high concentration impurities into a semiconductor. In addition, the pin type PD is formed by doping impurities of a particularly high concentration such as approximately $1.0 \times 10^{20}$ cm$^{-3}$ in order to provide an ohmic contact, which does not have rectification in the interfaces between the metal and the semiconductor.

The respective structures have their own advantages and disadvantages. The MSM type structure does not need doping, which makes the manufacturing process simple, and has such characteristics that high speed operation is excellent. Meanwhile, the region that has rectification, that is to say, the region in which photocarriers are to be generated through light absorption, is close to a metal, and therefore, it is difficult to avoid light absorption by the metal, which makes it difficult to provide good properties in terms of the sensitivity of light reception. Another problem arises such that the sensitivity deteriorates due to a recombination of electron and hole pairs trapped by the surface state. In addition, the band structure in the Schottky interface in the junction between a metal and a semiconductor is determined by the work function of the metal and the Fermi level of the semiconductor, and therefore, the properties of the PDs are almost uniquely determined by the materials used therein and have such defects that the controllability is low. In the case of a Ge material that is used in the field of Si-photonics in particular, the Schottky barrier vis-à-vis a typical electrode metal such as Al is low, and therefore, there is a defect that a dark current becomes high, making it easy for the noise properties to deteriorate.

In contrast, the pin type structure requires slightly more complicated steps in the manufacturing process because it is necessary to control the doping profile, and an increase in the area of the pin junction directly leads to an increase in the capacitance of the device, and therefore, the pin type structure has such defects that high speed operation is slightly more difficult. However, the pin type structure has such an advantage that the properties can be adjusted in accordance with the application by appropriately designing the doping profile even when the same materials are used. Furthermore, light can be made to efficiently enter into a very narrow range by using a waveguide type PD, and therefore, it is easy to achieve high sensitivity even when the PD is miniaturized so as to make the capacitance of the device small. Accordingly, it is possible to solve the problems with the high speed operation, which are the above-described defects of the pin type structure. Judging from the above-described comparison between the advantages and the disadvantages, a waveguide type Ge-pin type light receiving device has been diligently researched and developed as the most prospective structure in the current Si-photonics field (see Patent Literature 1 and Non-Patent Literature 1).

FIGS. 18A and 18B are diagrams illustrating a conventional waveguide type Ge-pin type light receiving device. FIG. 18A is a perspective diagram, and FIG. 18B is a cross-sectional diagram along the single-dotted chain line parallelogram in FIG. 18A. A Si fine line waveguide 63, a tapered waveguide 64 and a Si pedestal are formed by processing an SOI (Si on insulator) layer provided on the Si substrate 61 with a BOX (buried oxide) layer 62 in between. This Si pedestal is doped with B (boron) so as to become a p type Si layer 65.

After providing an $SiO_2$ film 66 on the entirety of the surface, an opening is created in the $SiO_2$ film 66, and an i type Ge layer 67 is selectively grown within this opening. The upper portion of the i type Ge layer 67 is doped with P (phosphorous) so as to provide an n type Ge layer 68. A pin type photodiode is formed of the p type Si layer 65, the i type Ge layer 67 and the n type Ge layer 68. Next, an $SiO_2$ film 69 is provided, and after that, contact holes that reach the p type Si layer 65 and the n type Ge layer 68 are created, and these contact holes are filled in with a conductive member so as to provide an n side electrode 70 and a p side electrode 71. In this case, the BOX layer 62 works as a lower clad layer, and the $SiO_2$ films 66 and 69 work as an upper clad layer, and therefore, light is confined within the Si fine line waveguide 63.

Ge has a refractive index that is higher than that of Si, and therefore, light that propagates through the Si fine line waveguide 63 is led to the i type Ge layer 67 through evanescent optical coupling and absorbed so as to generate photocarriers. A reverse bias is applied between the p side electrode 70 and the n side electrode 71 so that the n type Ge layer 68 is at a higher voltage relative to the p type Si layer 65 so that the photocarriers are drawn out, which makes the system work as a photodiode.

CITATION LIST

Patent Literature

Patent Literature 1: Japanese Laid-open Patent Publication No. 2014-192472

Non-Patent Literature

Non-Patent Literature 1: T. Yin et al., Optics Express, vol. 15, p. 13965 (2007)
Non-Patent Literature 2: G. Masini et al., IEEE Transaction on Electron Devices, vol. 48, p. 1092 (2001)

SUMMARY

In the conventional structure illustrated in FIGS. 18A and 18B, there is a reason why two current paths including the respective electrodes are provided to the p type Si layer 65. By adopting this structure, the series resistance component within the p type Si layer 65 can be halved. The device resistance determines the response rate of the device as a time constant together with the capacitance, and therefore, it is very important to suppress this, particularly in the applications where high speed operation is required.

Several ways are possible in the method for connecting (mounting) this three-electrode type, waveguide type Ge-pin type light receiving device to (onto) an electronic circuit such as an amplifier, for example, a TIA (trans-impedance amplifier) and a bias power supply for applying a voltage. They respectively have a problem which is described in reference to FIGS. 19A through 20B.

FIGS. 19A through 20B are diagrams illustrating a connection method between a waveguide type, Ge-pin type light receiving device and an electronic circuit. FIG. 19A illustrates a case where a circuit that is referred to as a bias T is used. A signal is taken out through an n side electrode 70, that is to say, the connection to a signal amplifier is achieved through the n side electrode 70, which is also used for the connection to a positive bias power supply for applying a voltage. Though there are such advantages in that the connection is simple and the bias power supply may provide a positive voltage, the bias T 72, which is an extra circuit, is necessary. Precise design and manufacturing are required for a bias Tee that operates at a high speed and that does not cause an extremely lowsignal to deteriorate, and therefore, this mounting method is significantly disadvantageous in terms of cost.

In the system illustrated in FIG. 19B, a signal line connected to an amplifier is connected to an n side electrode 70 that makes contact with an n type Ge layer 68, and a negative bias power supply 74 is connected to a p side electrode 71 that makes contact with a p type Si layer 65, and thus, the connection to the signal line and the connection to the negative bias power supply 74 are achieved separately. In this case, no bias Tee is required, but a negative voltage supply is necessary for the application of a reverse bias that is necessary for a photodiode. A positive voltage supply is necessary for the operation of electronic parts such as a TIA and a retimer that is generally required for a receiver of a high speed signal, and therefore, it is necessary to secure two series of voltage supplies in the case where this system is used for the photodiode connection, which is also significantly disadvantageous in terms of the cost.

FIG. 20A illustrates a case where a signal line is connected to a p side electrode 71 that makes contact with a p side Si layer 65, and a positive bias power supply 73 is connected to an n side electrode 70 that makes contact with an n type Ge layer 68. In this case, though a negative voltage supply is not necessary, two series of signal lines are necessary. Though there has been no description so far, each electrode of a general photodiode and an electronic circuit are electrically connected through a solder structure in a hemispherical form, which is referred to as a bump, or a gold wire. These connection portions have a parasitic capacitance and a parasitic inductance of which the dimensions cannot be ignored. In the case where the signal line has two current paths, the parasitic capacitance becomes two times greater, which is disadvantageous as a receiver for high speed applications in terms of properties. Here, the bias power supply line does not need a high speed signal, and therefore, there are no problems with the bias power supply line having two current paths.

In the system illustrated in FIG. 20B, the photodiode has a different structure. That is to say, a structure where impurities are doped so that the conductivity types are opposite in such a manner that the Ge layer in the upper portion is of the p type, and the Si layer in the lower portion becomes an n type semiconductor. In addition, a signal line is connected to a p side electrode 71 that makes contact with a p type Ge layer 77, and a positive bias power supply 73 is connected to an n side electrode 70 that makes contact with an n type Si layer 75. In this case, a bias Tee is unnecessary, and only a positive voltage supply can be used as the voltage supply, which is the power supply for everything including the TIA. The signal line has only one current path, and therefore has no disadvantage regarding the parasitic capacitance and the parasitic inductance.

In the structure illustrated in FIG. 20B, the problems seem to have been solved at first glance. In this structure, however, it is known that the light receiving properties of the photodiode cannot be secured (see Non-Patent Literature 2). In the case where a Ge thin film is formed on the n type Si layer 75, the effects of the level of the acceptors that are generated by the crystal defects in the Si/Ge interface cause the electrical field intensity to deteriorate within the Ge thin film. As a result, the photocarriers are prevented from being transported, which causes the sensitivity of light reception to significantly deteriorate.

As described above, in the case where a conventional Ge-pin type photodiode is used, there is a major problem in mounting it onto an electronic circuit in terms of the cost and the properties.

A semiconductor light receiving device, including: a substrate; a semiconductor fine line waveguide provided on the substrate; and a light receiving unit that is provided on the substrate and that absorbs light propagating through the semiconductor fine line waveguide, wherein
    the light receiving unit includes: a p type first semiconductor layer; a number of second semiconductor mesa structures provided on the p type first semiconductor layer in such a manner that an n type second semiconductor layer is provided on top of an i type second semiconductor layer; a p side electrode connected to the p type first semiconductor layer in a location between the second semiconductor mesa structures; and an n side electrode connected to the n type second semiconductor layer,
    the refractive index and the optical absorption coefficient of the second semiconductor layers are greater than the refractive index and the optical absorption coefficient of the first semiconductor layer,
    a positive bias power supply is connected to the n side electrode, and
    a signal line is connected to the p side electrode.

According to one aspect of the invention, it is possible in a semiconductor light receiving device to reduce the number of parts that are mounted on a circuit, to make a negative power supply unnecessary, and to avoid the deterioration in the electrical field intensity in the light receiving unit.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
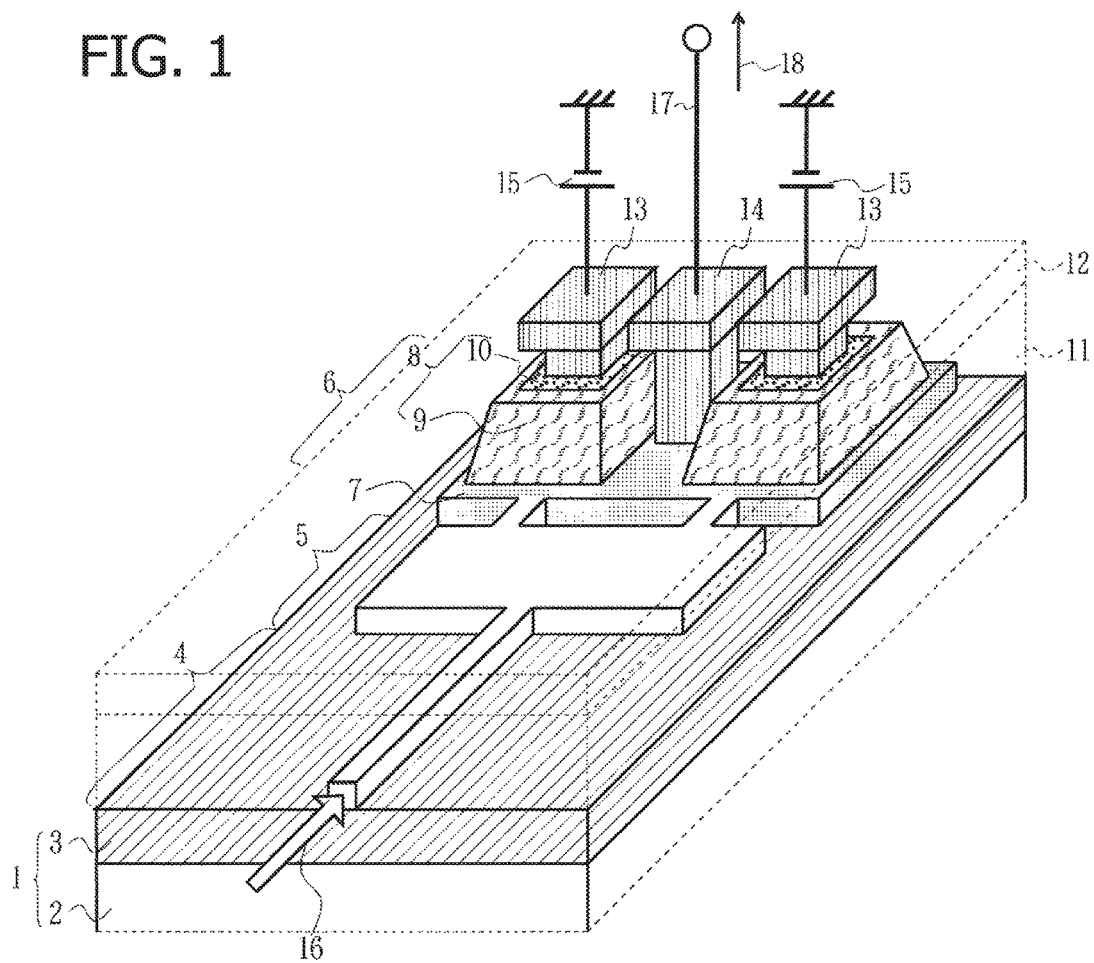
FIG. 1 is a diagram illustrating the semiconductor light receiving element according to an embodiment of the present invention.

Here, the semiconductor light receiving device according to an embodiment of the present invention is described in reference to FIG. 1. FIG. 1 is a diagram illustrating the semiconductor light receiving device according to an embodiment of the present invention, where a semiconductor fine line waveguide line 4 and a light receiving unit 6 that absorbs light 16 that propagates through the semiconductor fine line waveguide 4 are provided on a substrate 1. The light receiving unit 6 has: a p type first semiconductor layer 7; and a number of second semiconductor mesa structures 8 that are made of an i type second semiconductor layer 9 provided on the p type first semiconductor layer 7 and an n type second semiconductor layer 10 provided in the upper portion of the i type second semiconductor layer 9. A p side electrode 14 is provided to a p type first semiconductor layer 7 between the second semiconductor mesa structures 8, and at the same time, an n side electrode 13 is provided to the n type second semiconductor layer 10.

At this time, the refractive index and the optical absorption coefficient of the second semiconductor layer are greater than the refractive index and the optical absorption coefficient of the first semiconductor layer. Typically, an Si layer is used for the first semiconductor layer, and either $Si_xGe_{1-x}$ (here, 0≤x 0.5) or $Ge_{1-x}Sn_x$ (here, 0≤x≤0.1) is used for the second semiconductor layer.

In addition, an optical branching unit 5 that branches either light 16 that propagates through the semiconductor fine line waveguide 4 or the position of the light intensity peak into the same number of pieces as that of the second semiconductor mesa structures 8 may be provided between the semiconductor fine line waveguide 4 and the light receiving unit 6.

A multimode interferometer coupler (MMI coupler) may be used as the optical branching unit 5. At this time, the multimode interferometer coupler is integrated in such a manner that the p type first semiconductor layer 7 becomes part of the multimode interferometer coupler, and thus, the yield in the manufacture increases. Alternatively, a directional coupler or a branching waveguide such as a Y type branching waveguide may be used as the optical branching unit 5.

Though two is a typical number of the second semiconductor mesa structures 8, three structures may be provided, and in this case, it is possible to increase the amplitude by using a differential signal.

In the case where two second semiconductor mesa structures 8 are provided, a semiconductor fine line waveguide through which light enters into one of the second semiconductor mesa structures 8 in the first direction and a semiconductor fine line waveguide through which light enters into the other second semiconductor mesa structure 8 in the second direction that is opposite to the first direction may be provided. By providing such a bidirectional, light entering type semiconductor light receiving device, it becomes easy to incorporate the semiconductor light receiving device into an optical multiplexor using an add-drop type ring resonator array.

As for the substrate 1 on which such a semiconductor light receiving device is formed, a typical example is an SOI substrate where a single crystal semiconductor layer is provided on a single crystal semiconductor substrate 2 with a buried insulating layer 3 in between. In this case, the semiconductor fine line waveguide 4, the optical branching unit 5 and the first semiconductor layer may be formed by processing this single crystal semiconductor layer.

In the semiconductor light receiving device according to the embodiment of the present invention, a signal 18 is taken out from the p side electrode 14 that is formed on the p type first semiconductor layer 7 between the second semiconductor mesa structures 8, and a positive bias power supply 15 for applying an electrical field is connected to the n side electrodes 13 provided on the n type second semiconductor layer 10. The structure has a number of paths through which a photocurrent flows, and therefore is a structure that is appropriate for high speed operation where the device resistance is suppressed.

In addition, a reverse bias state can be achieved from the relationship between the bias power supply path and the signal output path without using a bias Tee or a negative voltage supply, and therefore, the semiconductor light receiving device is very advantageous regarding the cost as compared to the conventional structure. Furthermore, the bias power supply path is the n side electrodes 13 that make contact with the n type second semiconductor layer 10, and therefore, the power supply that is required at the time when a reverse bias that is necessary for a photodiode is applied may be a positive voltage supply in the same manner as for the operation of a TIA, and as a result, no more than one voltage supply is necessary in the whole receiver. Moreover, the number of signal lines 17 is at the minimum, which can prevent an excessive parasitic capacitance or an excessive parasitic inductance from being generated at the time of circuit connection.

In addition, the same polarities as in the conventional structure can be maintained as the polarities of the semiconductor materials within the photodiode, and therefore, such problems that the intensity of the electrical field generated in the Ge materials on Si lowers and the sensitivity in the reception deteriorates together with this can be avoided in the case where the polarities of the semiconductor materials are altered from the conventional structure.

EXAMPLE 1

Figure 2:
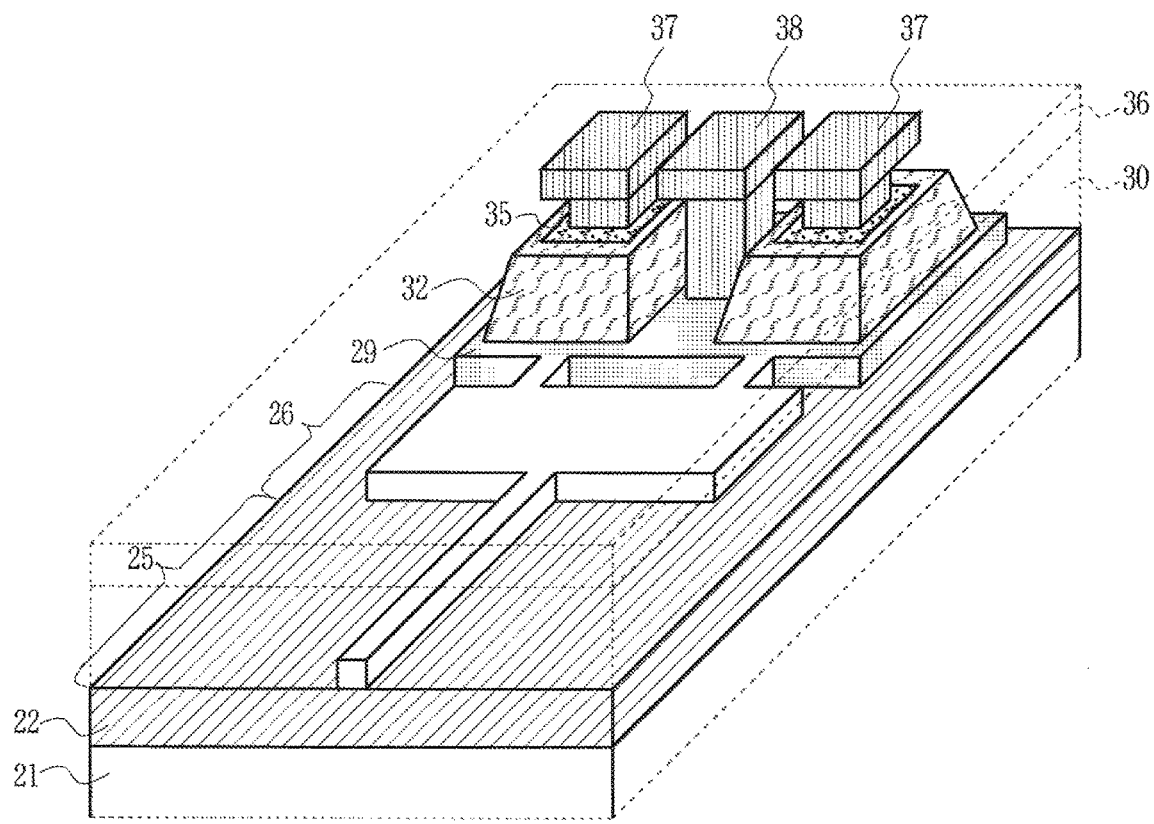
FIG. 2 is a perspective diagram illustrating the semiconductor light receiving device according to Example 1 of the present invention.

Next, the semiconductor light receiving device according to Example 1 of the present invention is described in reference to FIGS. 2 through 10B. FIG. 2 is a perspective diagram illustrating the semiconductor light receiving device according to Example 1 of the present invention, where an Si fine line waveguide 25, a 1×2 MMI coupler 26 and a light receiving unit are provided on a single crystal silicon substrate 21 with a BOX layer 22 in between. The light receiving unit is formed of two mesa structures made of an i type Ge layer 32 and an n type Ge layer 35 provided on a p type Si layer 29.

A p side electrode 38 is provided so as to make contact with the p type Si layer between the two mesa structures, and at the same time, n side electrodes 37 are provided so as to make contact with the n type Ge layer 35. Though not shown, a positive bias power supply is connected to the n side electrodes 37, and a signal line is connected to the p side electrode 38.

An $SiO_2$ film 30 works as a mask for selective area growth when the mesa structures are formed, and an $SiO_2$ film 36 becomes an insulating passivation film when the n side electrodes 37 and the p side electrode 38 are formed. In addition, the BOX layer 22 becomes a lower clad layer for the Si fine line waveguide 25, and the $SiO_2$ films 30 and 36 become an upper clad layer, and therefore, light is effectively confined within the Si fine line waveguide 25.

Light that propagates through the Si fine line waveguide 25 is converted to a guided mode having two intensity peaks by the MMI coupler 26, and after that is led to and absorbed by the i type Ge layer 32 through the evanescent optical coupling so as to generate photocarriers. A reverse bias is applied to this pin structure by the positive bias power supply, and therefore, the photocarriers are drawn out, and thus, the pin structure operates as a photodiode.

Figure 3A:
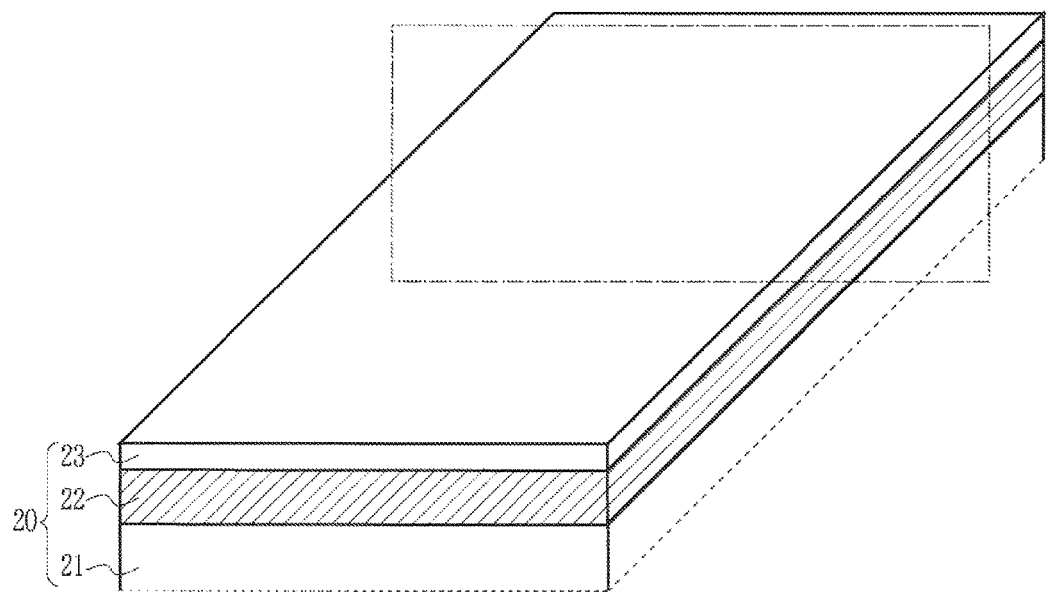
FIGS. 3A and 3B are diagrams illustrating the semiconductor light receiving device according to Example 1 of the present invention up to a certain step in the manufacturing process.
Figure 3B:
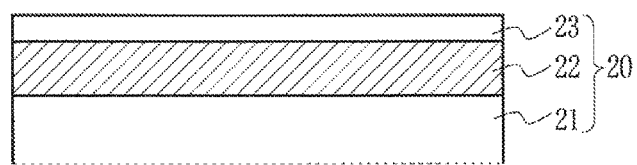

Next, the manufacturing process for the semiconductor light receiving device according to Example 1 of the present invention is described in reference to FIGS. 3A through 10B. FIGS. 3A, 4A, 5A, 6A, 7A, 8A, 9A and 10A are perspective diagrams, and FIGS. 3B, 4B, 5B, 6B, 7B, 8B, 9B and 10B are cross-sectional diagrams along the single-dotted chain line parallelogram in FIGS. 3A, 4A, 5A, 6A, 7A, 8A, 9A and 10A, respectively. First, as illustrated in FIGS. 3A and 3B, an SOI substrate 20 where a single crystal silicon layer 23 is provided on a single crystal silicon substrate 21 with a BOX layer 22 in between is prepared. Here, the thickness of the single crystal silicon substrate 21 is 500 μm, the thickness of the BOX layer 22 is 2 μm, and the thickness of the single crystal silicon layer 23 is 250 nm.

Figure 4A:
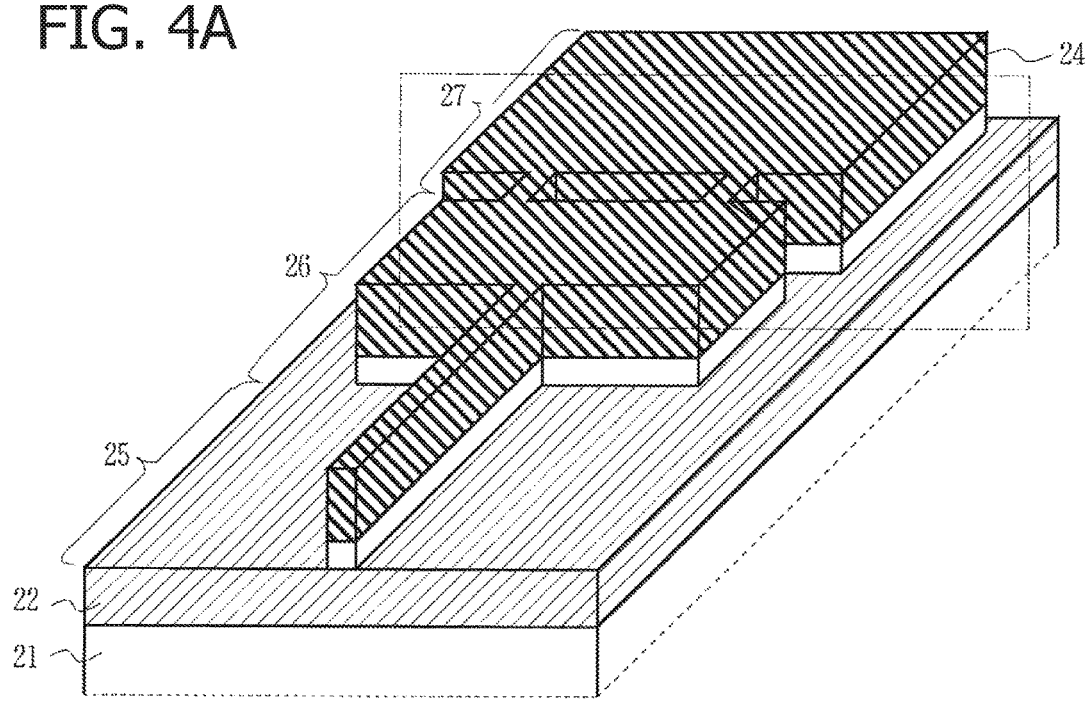
FIGS. 4A and 4B are diagrams illustrating the semiconductor light receiving device according to Example 1 of the present invention up to a certain step in the manufacturing process after the step in FIGS. 3A and 3B.
Figure 4B:
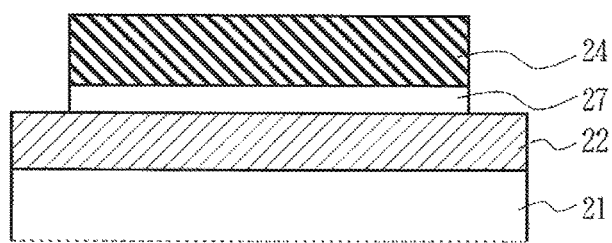

Next, as illustrated in FIGS. 4A and 4B, the single crystal silicon layer 23 is etched using the patterned photoresist 24 having a predetermined form as a mask so that an Si fine line waveguide 25, a 1×2 MMI coupler 26 and an Si pedestal 27 are formed.

Figure 5A:
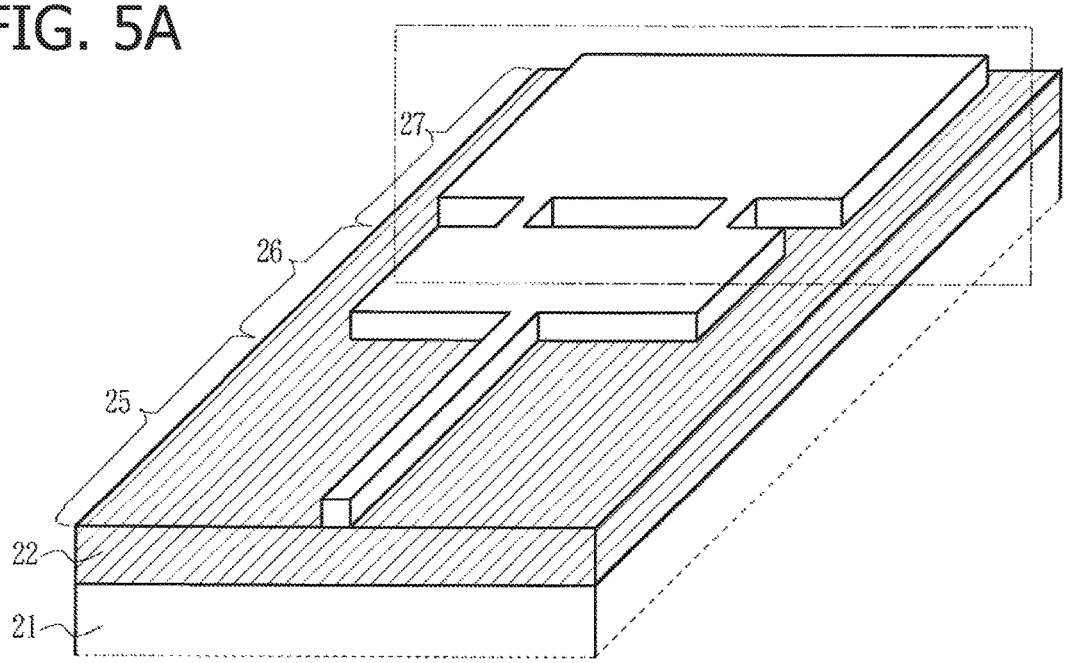
FIGS. 5A and 5B are diagrams illustrating the semiconductor light receiving device according to Example 1 of the present invention up to a certain step in the manufacturing process after the step in FIGS. 4A and 4B.
Figure 5B:
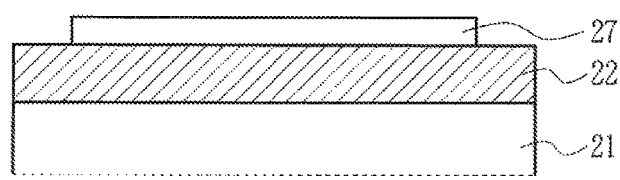

Next, as illustrated in FIGS. 5A and 5B, the patterned photoresist 24 is removed so that the Si fine line waveguide 25, the 1×2 MMI coupler 26 and the Si pedestal 27 emerge. Here, the width of the Si fine line waveguide 25 is 450 nm, and the size of the Si pedestal is 20 μm×35 μm.

Figure 6A:
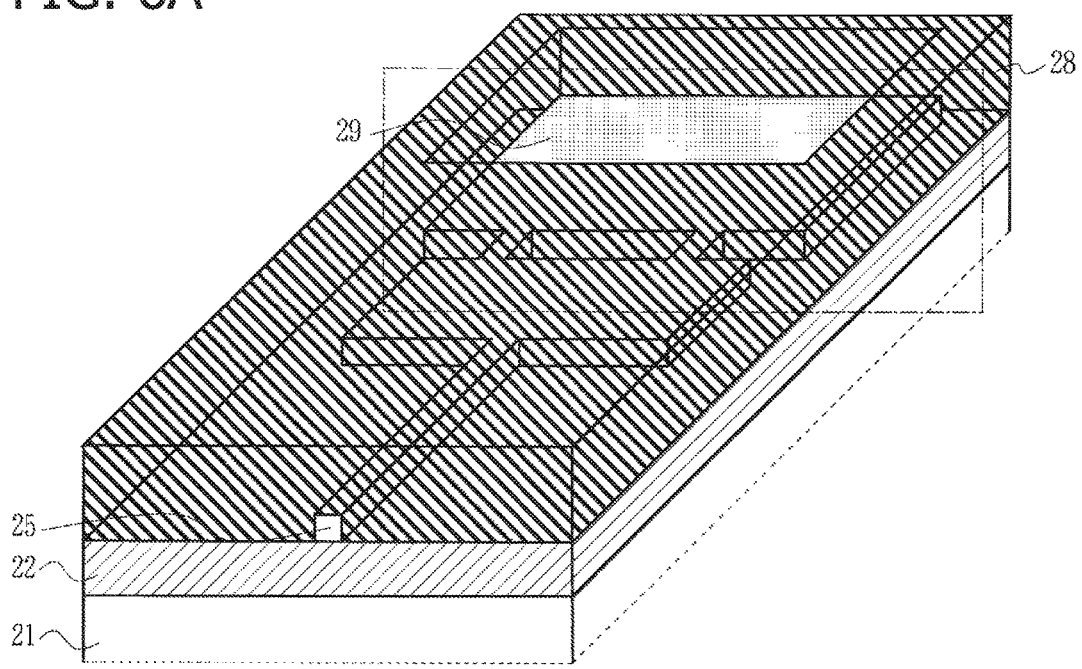
FIGS. 6A and 6B are diagrams illustrating the semiconductor light receiving device according to Example 1 of the present invention up to a certain step in the manufacturing process after the step in FIGS. 5A and 5B.
Figure 6B:
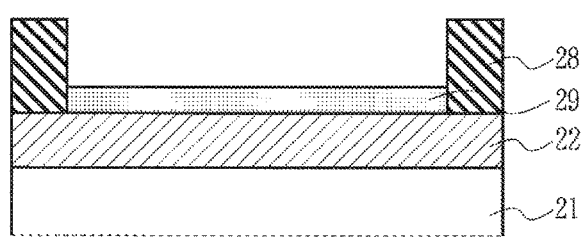

Next, as illustrated in FIGS. 6A and 6B, the patterned photoresist 28 having an opening for exposing the Si pedestal 27 is used as a mask to implant B (boron) ions, and after that, annealing for activation is carried out so as to convert the Si pedestal 27 to a p type Si layer 29. Here, the impurity concentration in the p type Si layer 29 is $2.0 \times 10^{18}$ cm$^{-3}$, and the annealing for activation is carried out at 1000° C. for one minute. It is not necessary to convert the whole region of the Si pedestal 27 into p type Si, and the peripheral portion may remain i type Si.

Figure 7A:
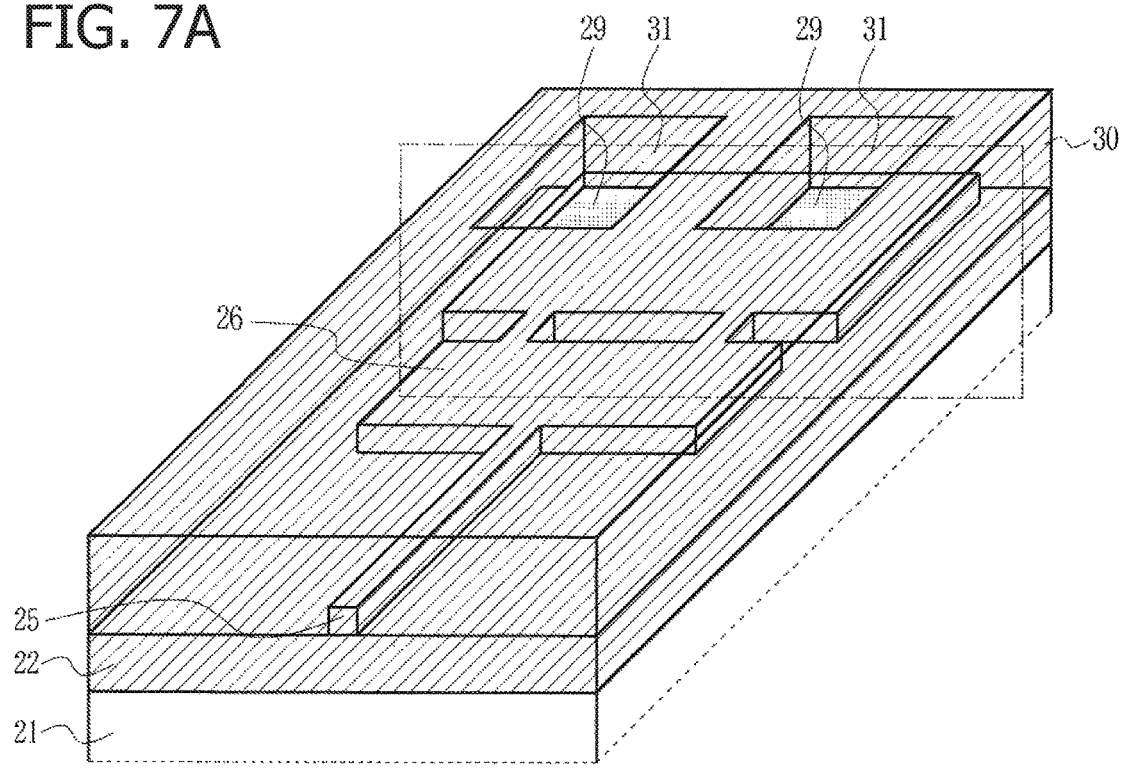
FIGS. 7A and 7B are diagrams illustrating the semiconductor light receiving device according to Example 1 of the present invention up to a certain step in the manufacturing process after the step in FIGS. 6A and 6B.
Figure 7B:
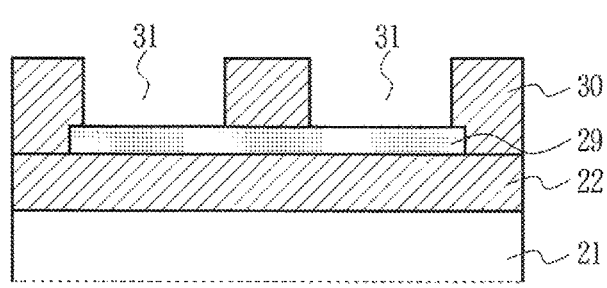

Next, as illustrated in FIGS. 7A and 7B, the patterned photoresist 28 is removed, and after that, an SiO$_2$ film 30 is grown in accordance with a CVD method (chemical vapor deposition method), and two openings 31 are created in locations that correspond to the p type Si layer 29 through photolithography and dry etching so as to provide a mask for selective area growth. Here, the thickness of the SiO$_2$ film 30 is 100 nm, and the size of the openings 31 is a length of 30 μm and a width of 5 μm.

Figure 8A:
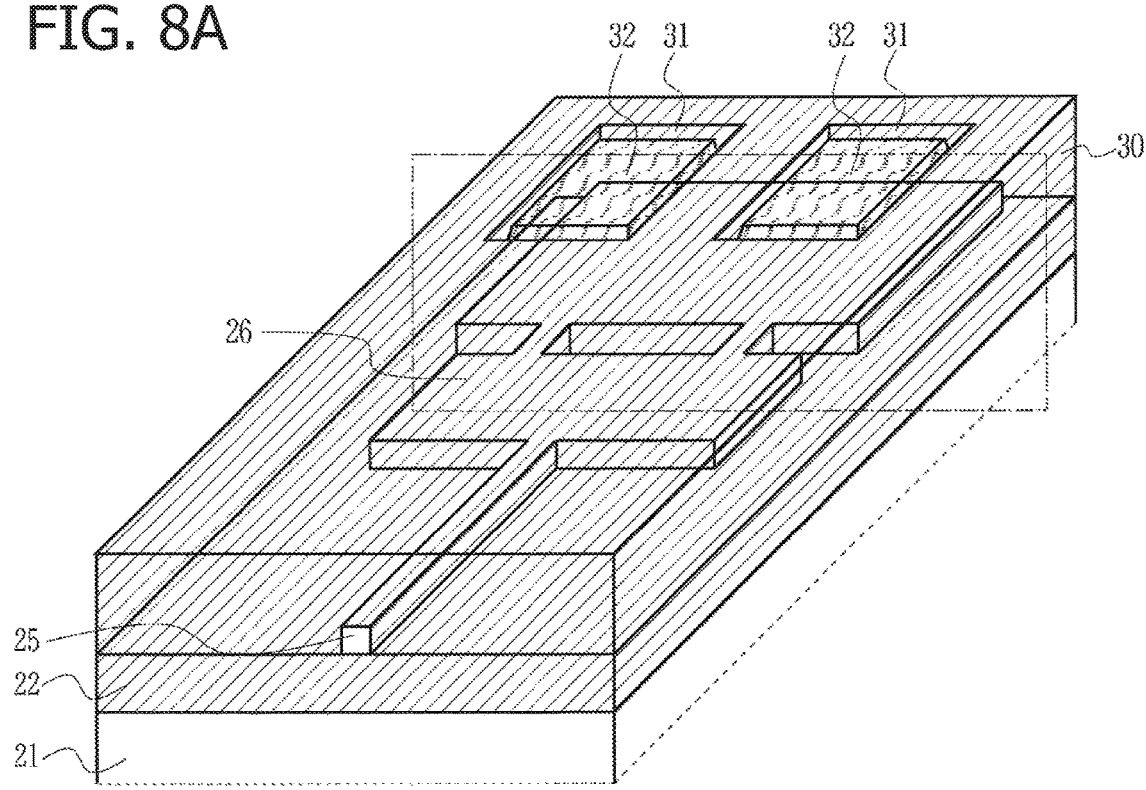
FIGS. 8A and 8B are diagrams illustrating the semiconductor light receiving device according to Example 1 of the present invention up to a certain step in the manufacturing process after the step in FIGS. 7A and 7B.
Figure 8B:
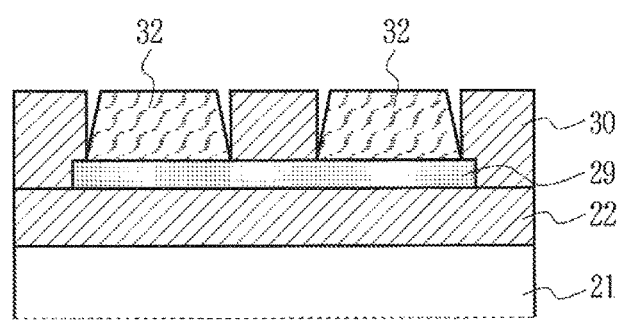

Next, as illustrated in FIGS. 8A and 8B, the SiO$_2$ film 30 provided with openings 31 is used as a mask for selective area growth so as to selectively grow an i type Ge layer 32 on the p type Si layer 29 in accordance with an LP-CVD method (low pressure chemical vapor deposition method). Here, the thickness of the i type Ge layer 32 is 1 μm.

Figure 9A:
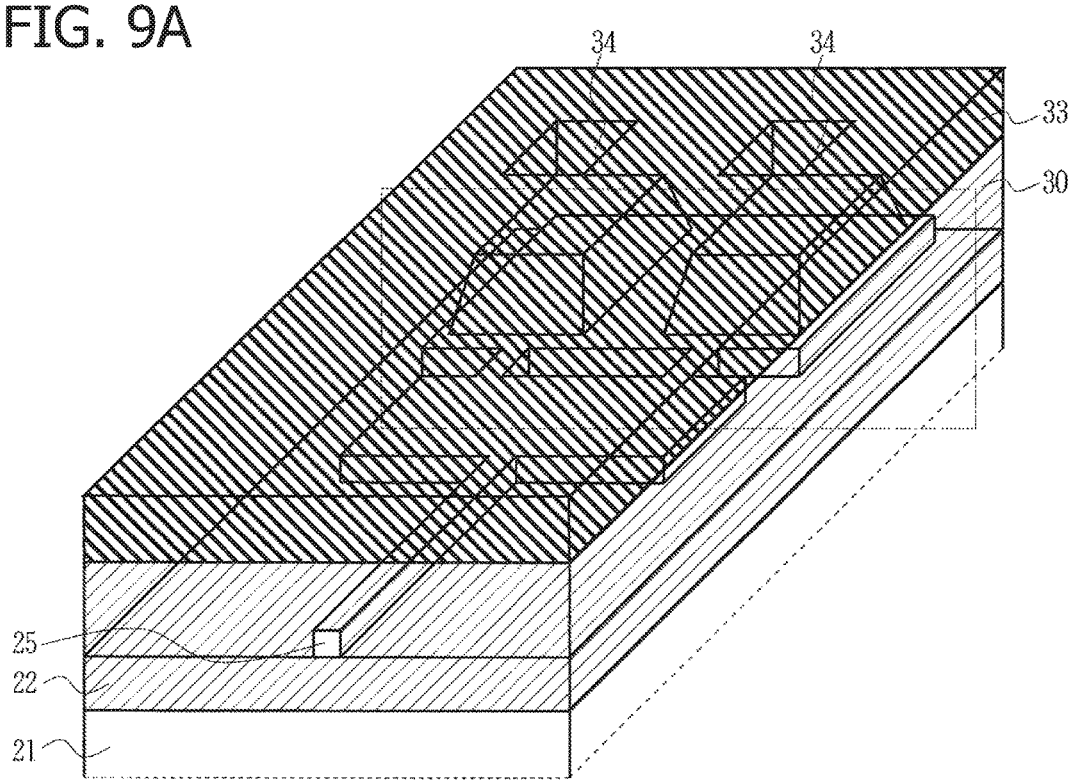
FIGS. 9A and 9B are diagrams illustrating the semiconductor light receiving device according to Example 1 of the present invention up to a certain step in the manufacturing process after the step in FIGS. 8A and 8B.
Figure 9B:
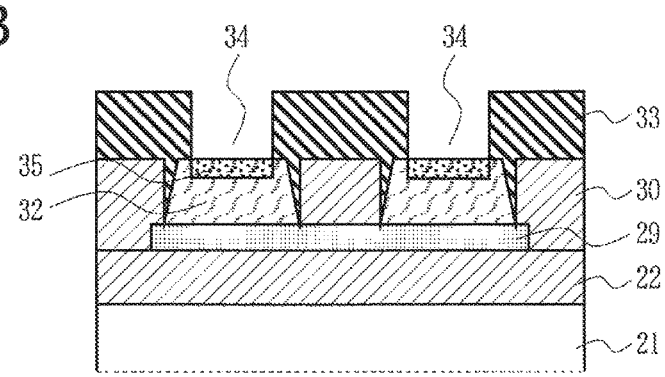
Figure 10A:
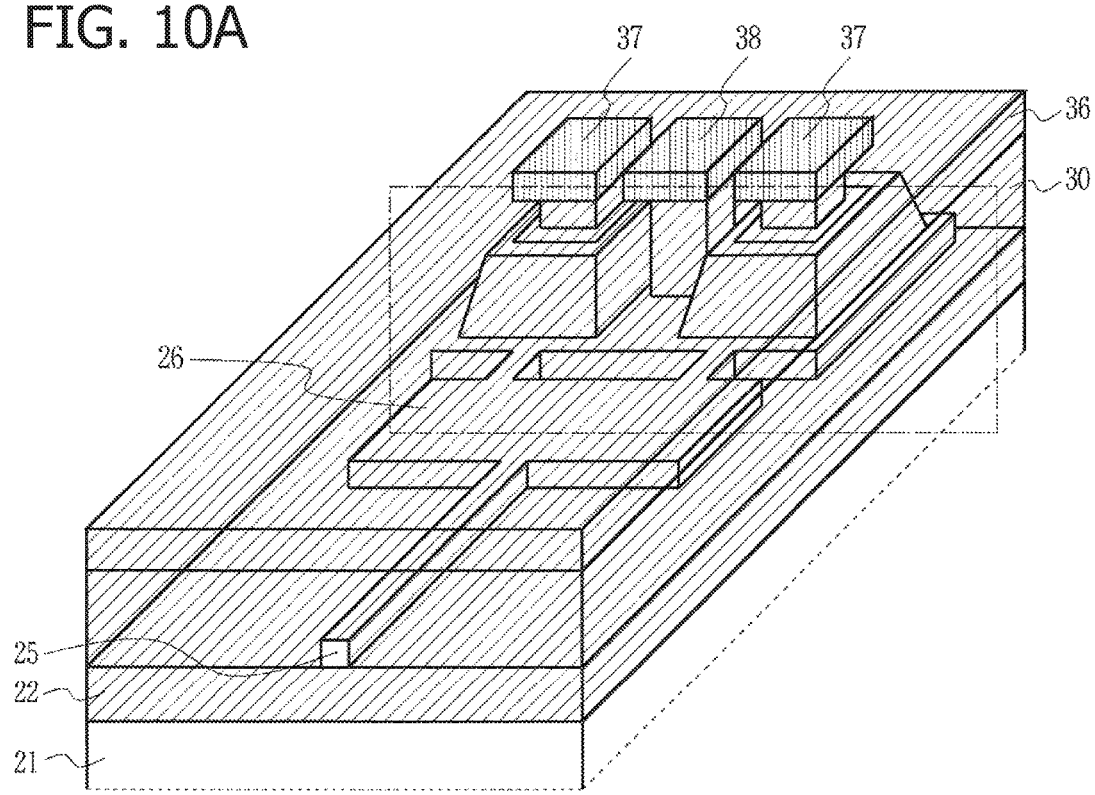
FIGS. 10A and 10B are diagrams illustrating the semiconductor light receiving device according to Example 1 of the present invention up to a certain step in the manufacturing process after the step in FIGS. 9A and 9B.
Figure 10B:
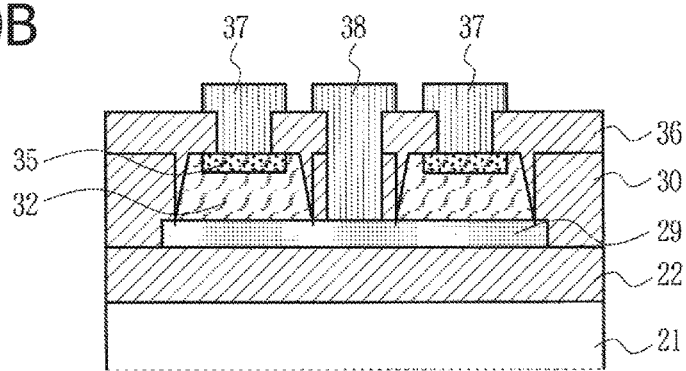

Next, as illustrated in FIGS. 9A and 9B, a patterned photoresist 33 having openings 34 provided in locations that correspond to the i type Ge layer 32 is used as a mask so as to implant P (phosphorous) ions. After that, annealing for activation is carried out to form an n type Ge layer 35. Here, the thickness of the n type Ge layer 35 is 0.2 μm, the impurity concentration is $2.0 \times 10^{19}$ cm$^{-3}$, and the annealing for activation is carried out at 600° C. for 10 seconds.

Next, the patterned photoresist 33 is removed, and after that, an SiO$_2$ film 36 is grown on the entire surface in accordance with a CVD method. Contact holes that reach the n type Ge layer 35 and the p type Si layer 29 are created in the SiO$_2$ film 36 through photolithography and dry etching. Subsequently, an Al film is deposited in accordance with a sputtering method, and after that, the Al film is patterned through photolithography and dry etching so as to form n side electrodes 37 and a p side electrode 38, and thus, the basic structure of the semiconductor light receiving device according to Example 1 of the present invention is complete.

In Example 1 of the present invention, the light receiving unit is provided with two mesa structures having the same arrangement as the related art in terms of the conductivity types, where a positive bias power supply is connected to the mesa structures and a signal line is connected to the p type Si layer, and therefore, the structure has two paths through which a photocurrent flows, and thus is appropriate for high speed operation with the device resistance being reduced.

In addition, a reverse bias state can be achieved from the relationship between the bias power supply path and the signal output path without using a bias Tee or a negative voltage supply, and therefore, the present structure is very advantageous in terms of cost as compared to the conventional structure. In addition, the signal line is only one line, and therefore can prevent the parasitic capacitance and the parasitic inductance from being excessively generated at the time of circuit connection.

EXAMPLE 2

Figure 11:
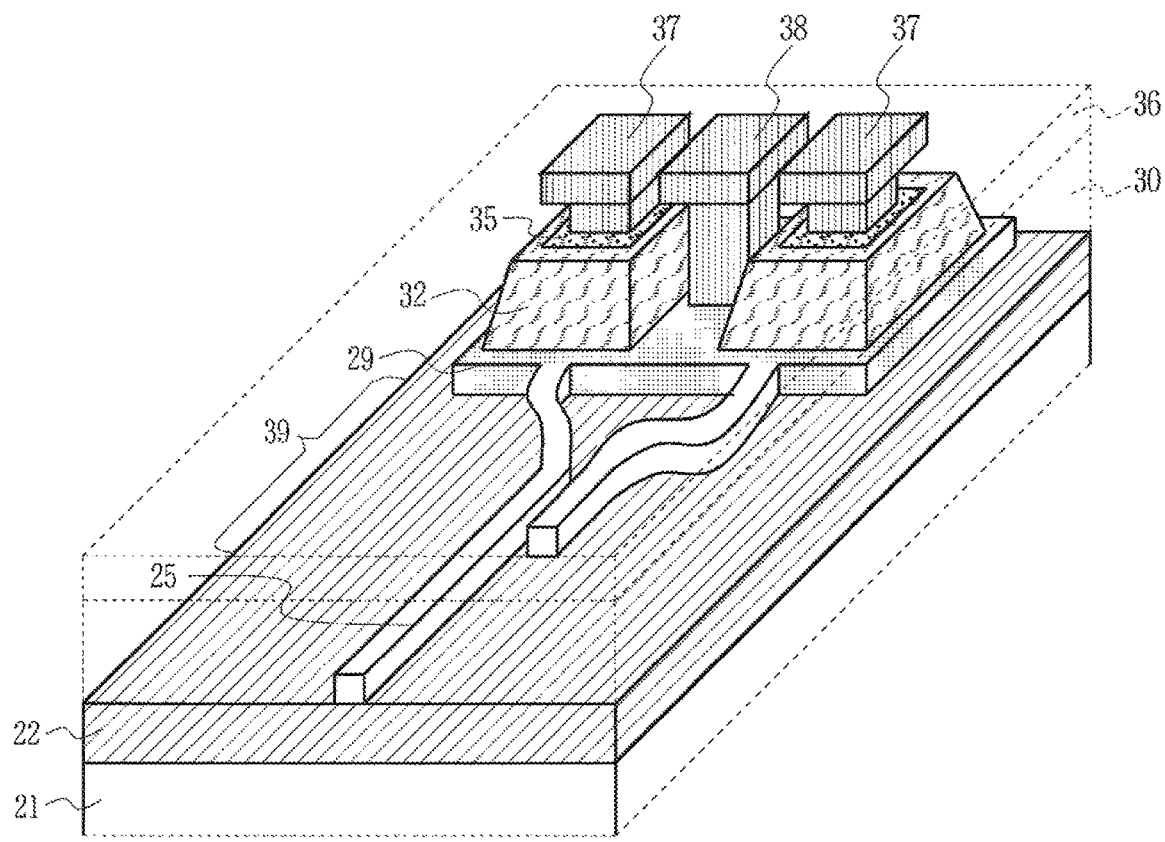
FIG. 11 is a perspective diagram illustrating the semiconductor light receiving device according to Example 2 of the present invention.

Next, the semiconductor light receiving device according to Example 2 of the present invention is described in reference to FIG. 11. The semiconductor light receiving device according to Example 2 has the same structure as that in Example 1, except that a directional coupler is used instead of the MMI coupler as an optical branching element, and therefore, only the final structure is described. FIG. 11 is a perspective diagram illustrating the semiconductor light receiving device according to Example 2 of the present invention, where a Si fine line waveguide 25, a directional coupler 39 and a light receiving unit are provided on a single crystal silicon substrate 21 with a BOX layer 22 in between. The light receiving unit is formed of two mesa structures made of an i type Ge layer 32 and an n type Ge layer 35 provided on a p type Si layer 29. Here, the directional coupler 39 is formed by processing the single crystal Si layer in the SOI substrate through etching in the same manner as the MMI coupler.

A p side electrode 38 is provided so as to make contact with the p type Si layer between the two mesa structures, and at the same time, n side electrodes 37 are provided so as to make contact with the n type Ge layer 35. Though not shown, a positive bias power supply is connected to the n side electrodes 37, and a signal line is connected to the p side electrode 38.

Light that propagates through the Si fine line waveguide 25 is split into two beams by the directional coupler 39, and after that is led to and absorbed by the i type Ge layer 32 through evanescent optical coupling so as to generate photocarriers. A reverse bias is applied to this pin structure by the positive bias power supply, and therefore, the photocarriers are drawn out, and thus, the pin structure operates as a photodiode. In the case of Example 2, the semiconductor light receiving device is different from that in Example 1 only in the optical branching structure, and thus has the same basic working effects as in Example 1.

EXAMPLE 3

Figure 12:
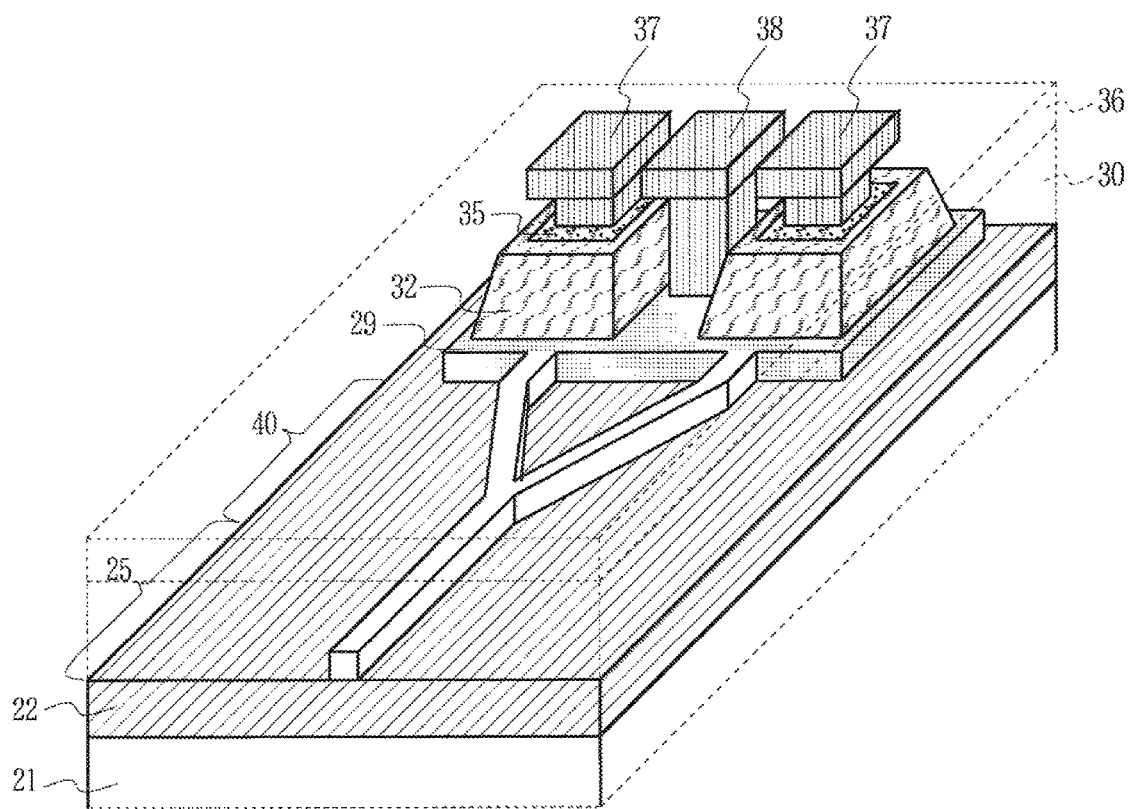
FIG. 12 is a perspective diagram illustrating the semiconductor light receiving device according to Example 3 of the present invention.

Next, the semiconductor light receiving device according to Example 3 of the present invention is described in reference to FIG. 12. The semiconductor light receiving device according to Example 3 has the same structure as that in Example 1, except that a Y-branch waveguide is used instead of the MMI coupler as an optical branching element, and therefore, only the final structure is described. FIG. 12 is a perspective diagram illustrating the semiconductor light receiving device according to Example 3 of the present invention, where an Si fine line waveguide 25, a Y-branch waveguide 40 and a light receiving unit are provided on a single crystal silicon substrate 21 with a BOX layer 22 in between. The light receiving unit is formed of two mesa structures made of an i type Ge layer 32 and an n type Ge layer 35 provided on a p type Si layer 29. Here, the Y-branch waveguide 40 is formed by processing the single crystal Si layer in the SOI substrate through etching in the same manner as the MMI coupler.

A p side electrode 38 is provided so as to make contact with the p type Si layer between the two mesa structures, and at the same time, n side electrodes 37 are provided so as to make contact with the n type Ge layer 35. Though not shown, a positive bias power supply is connected to the n side electrodes 37, and a signal line is connected to the p side electrode 38.

Light that propagates through the Si fine line waveguide 25 is split into two directions by the Y-branch waveguide, and after that is led to and absorbed by the i type Ge layer 32 through evanescent optical coupling so as to generate photocarriers. A reverse bias is applied to this pin structure by the positive bias power supply, and therefore, the photocarriers are drawn out, and thus, the pin structure operates as a photodiode. In the case of Example 3, the semiconductor light receiving device is different from that in Example 1 only in the optical branching structure, and thus has the same basic working effects as in Example 1.

EXAMPLE 4

Figure 13:
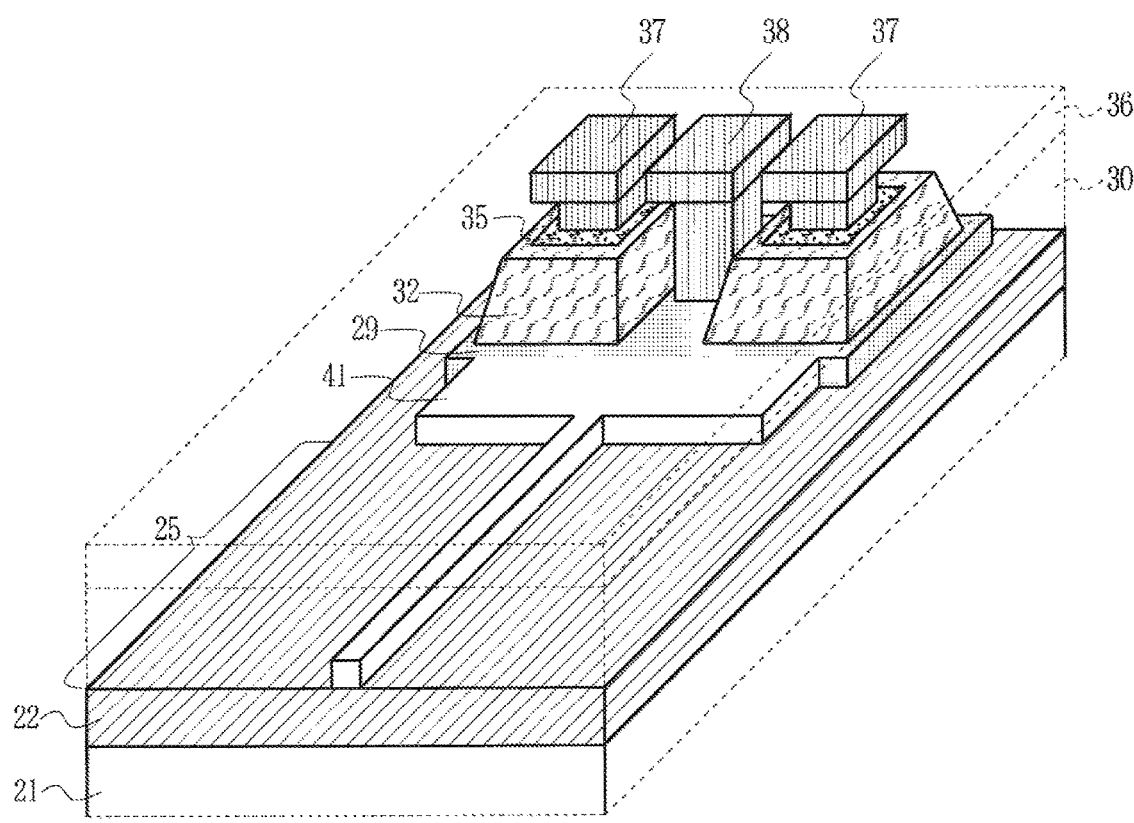
FIG. 13 is a perspective diagram illustrating the semiconductor light receiving device according to Example 4 of the present invention.

Next, the semiconductor light receiving device according to Example 4 of the present invention is described in reference to FIG. 13. The semiconductor light receiving device according to Example 4 has the same structure as that in Example 1, except that the MMI coupler is integrated with the light receiving unit through the p type Si layer instead of being separate from the light receiving unit, and therefore, only the final structure is described. FIG. 13 is a perspective diagram illustrating the semiconductor light receiving device according to Example 4 of the present invention, where an Si fine line waveguide 25, an MMI coupler 41 and a light receiving unit are provided on a single crystal silicon substrate 21 with a BOX layer 22 in between. The light receiving unit is formed of two mesa structures made of an i type Ge layer 32 and an n type Ge layer 35 provided on a p type Si layer 29. At this time, the p type Si layer 29 is also a part of the integrated MMI coupler 41.

A p side electrode 38 is provided so as to make contact with the p type Si layer between the two mesa structures, and at the same time, n side electrodes 37 are provided so as to make contact with the n type Ge layer 35. Though not shown, a positive bias power supply is connected to the n side electrodes 37, and a signal line is connected to the p side electrode 38.

Light that propagates through the Si fine line waveguide 25 is led to and absorbed by the i type Ge layer 32 through the evanescent optical coupling so as to generate photocarriers while being converted to a guided mode having two intensity peaks by the MMI coupler 41. A reverse bias is applied to this pin structure by a positive bias power supply, and therefore, the photocarriers are drawn out so that the pin structure operates as a photodiode.

In Example 4, the MMI coupler 41 is integrated with the p type Si layer 29, which makes it possible to miniaturize the device and makes the processing pattern simpler, and therefore, the manufacture yield increases.

EXAMPLE 5

Figure 14:
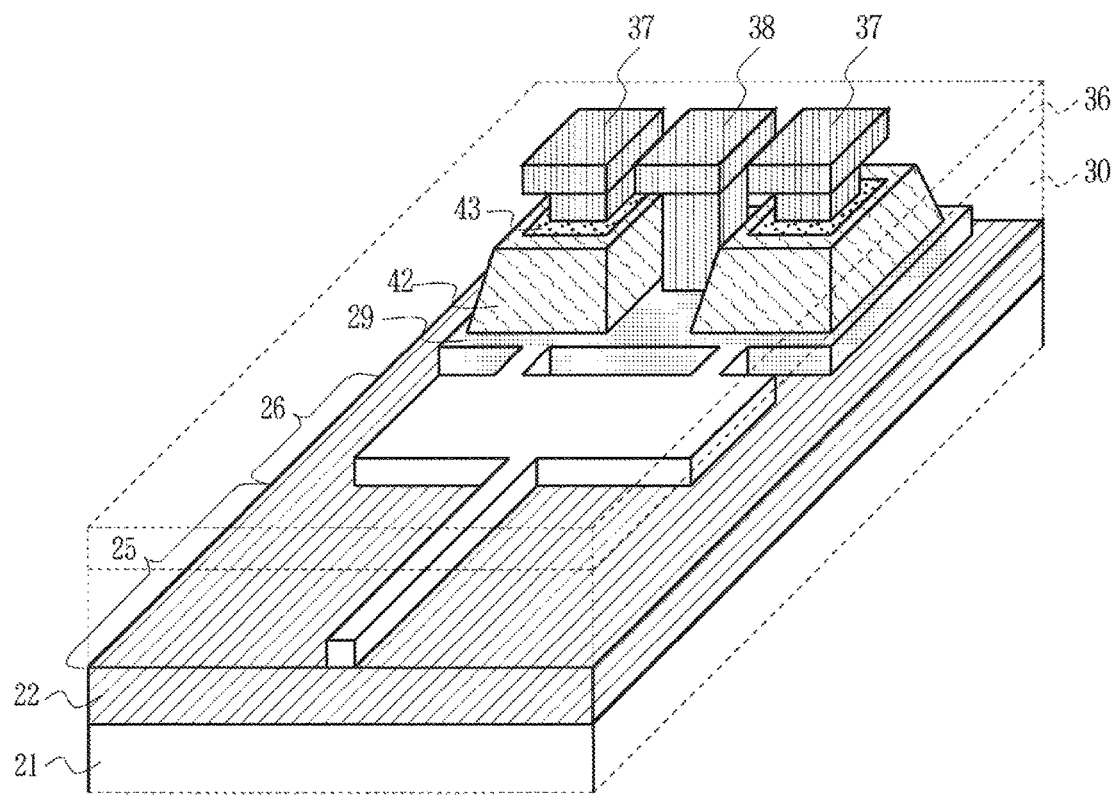
FIG. 14 is a perspective diagram illustrating the semiconductor light receiving device according to Example 5 of the present invention.

Next, the semiconductor light receiving device according to Example 5 of the present invention is described in reference to FIG. 14. The semiconductor light receiving device according to Example 5 has the same structure as that in Example 1, except that the mesa structures are formed of an SiGe layer, and therefore, only the final structure is described. FIG. 14 is a perspective diagram illustrating the semiconductor light receiving device according to Example 5 of the present invention, where an Si fine line waveguide 25, an MMI coupler 26 and a light receiving unit are provided on a single crystal silicon substrate 21 with a BOX layer 22 in between. The light receiving unit is formed of two mesa structures made of an i type SiGe layer 42 and an n type SiGe layer 43 provided on a p type Si layer 29. Here, a $Si_{0.2}Ge_{0.8}$ layer is used as the SiGe layer.

A p side electrode 38 is provided so as to make contact with the p type Si layer between the two mesa structures, and at the same time, n side electrodes 37 are provided so as to make contact with the n type SiGe layer 43. Though not shown, a positive bias power supply is connected to the n side electrodes 37, and a signal line is connected to the p side electrode 38.

Light that propagates through the Si fine line waveguide 25 is converted to a guided mode having two intensity peaks by the MMI coupler 26, and after that is led to and absorbed by the i type SiGe layer 42 through the evanescent optical coupling so as to generate photocarriers. A reverse bias is applied to this pin structure by a positive bias power supply, and therefore, the photocarriers are drawn out so that the pin structure operates as a photodiode.

In Example 5, the mesa structures are formed of an SiGe layer, and therefore, lattice mismatching vis-à-vis Si is mitigated as compared to a case where the mesa structures are formed of a Ge layer, and thus, epitaxial growth becomes easier. Though SiGe is used here, $Ge_{1-x}Sn_x$ (where $0 \le x \le 0.1$) may be used.

EXAMPLE 6

Figure 15:
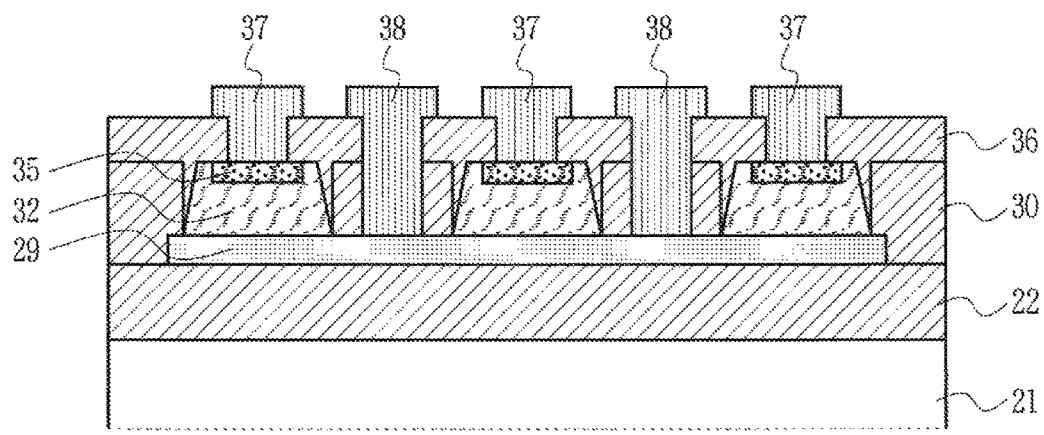
FIG. 15 is a cross-sectional diagram illustrating the semiconductor light receiving device according to Example 6 of the present invention.

Next, the semiconductor light receiving device according to Example 6 of the present invention is described in reference to FIG. 15. The semiconductor light receiving device according to Example 6 has the same structure as that in Example 1, except that three mesa structures are formed instead of two, and therefore, only the final structure is described. FIG. 15 is a cross-sectional diagram illustrating the semiconductor light receiving device according to Example 6 of the present invention, where the light receiving unit provided on a single crystal silicon substrate 21 with a BOX layer 22 in between is formed of three mesa structures made of a p type Si layer 29 and an i type Ge layer 32 and an n type Ge layer 35 that are provided on top of the p type Si layer 29.

p side electrodes 38 are provided so as to make contact with the p type Si layer in two locations between the three mesa structures, and at the same time, n side electrodes 37 are provided so as to respectively make contact with three portions of the n type Ge layer 35. Though not shown, a positive bias power supply is connected to the three n side electrodes 37, and a signal line is connected to the two p side electrodes 38.

In Example 6, three mesa structures and two signal lines are provided, and therefore, it is possible to increase the amplitude of a signal by carrying out a differential operation on the signal.

EXAMPLE 7

Figure 16:
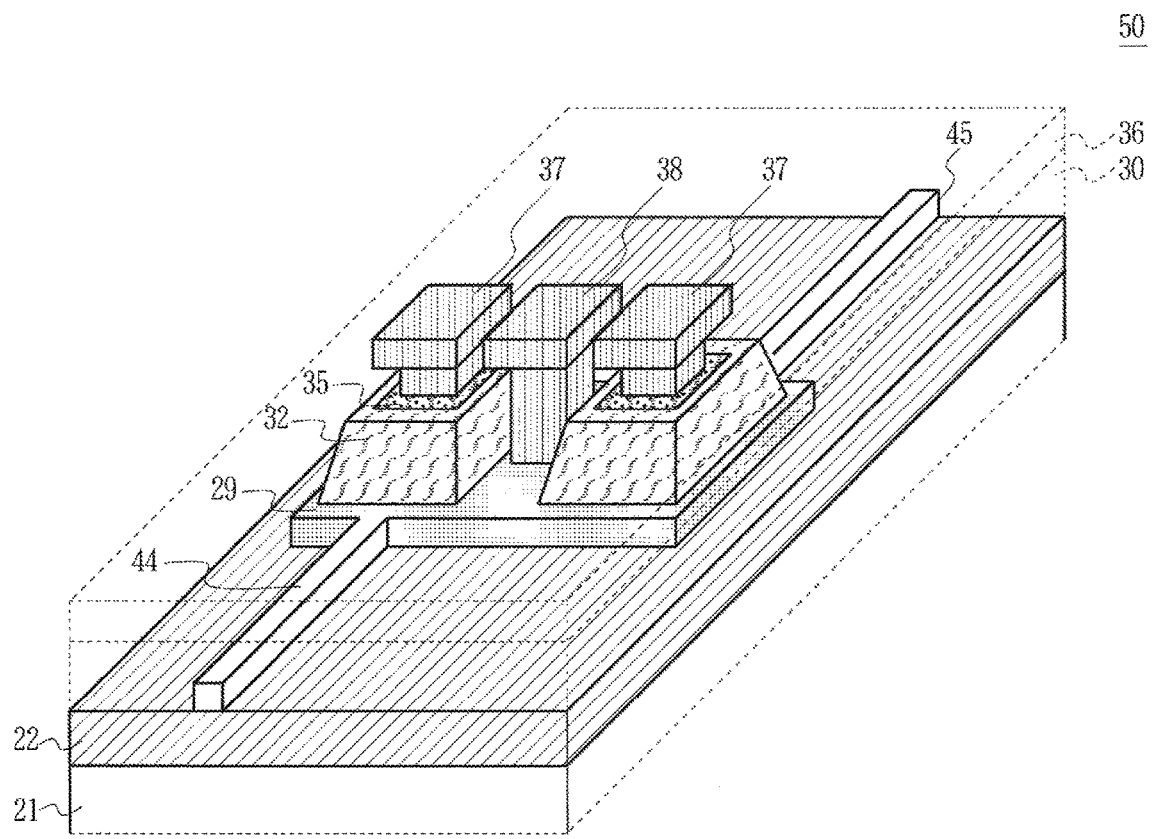
FIG. 16 is a perspective diagram illustrating the semiconductor light receiving device according to Example 7 of the present invention.
Figure 17:
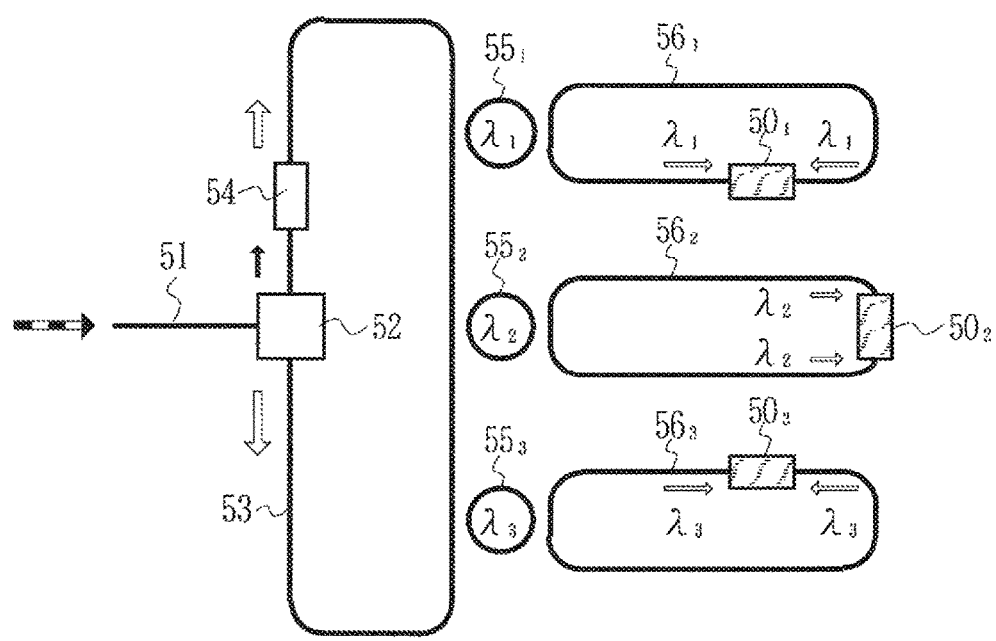
FIG. 17 is a diagram illustrating the structure of a multiplexing device using the semiconductor light receiving device according to Example 7 of the present invention.
Figure 18A:
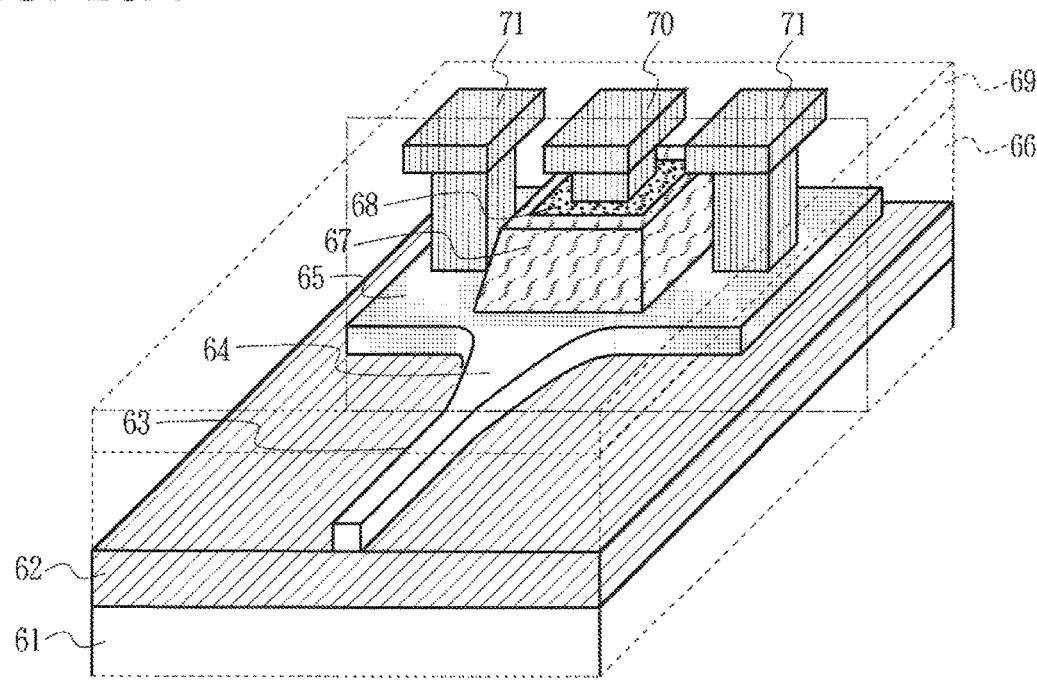
FIGS. 18A and 18B are diagrams illustrating a conventional waveguide type, Ge-pin type light receiving device.
Figure 18B:
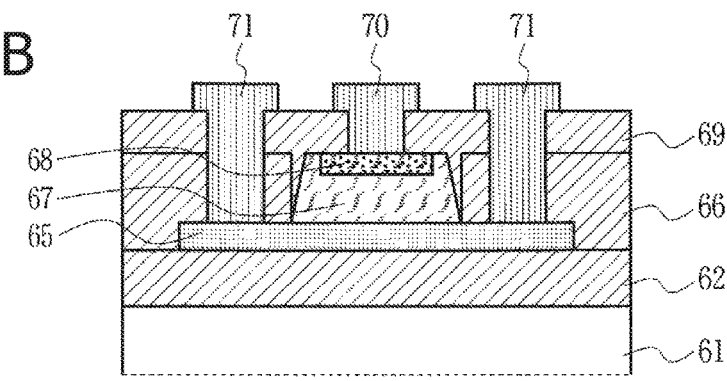
Figure 19A:
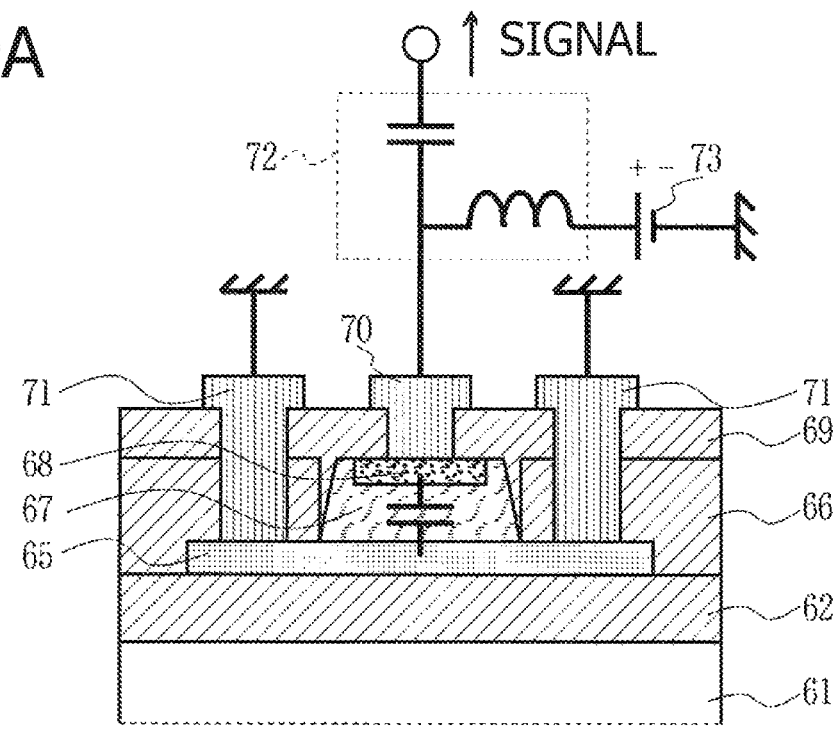
FIGS. 19A and 19B are diagrams illustrating a connection method between a conventional waveguide type, Ge-pin type light receiving device and an electronic circuit.
Figure 19B:
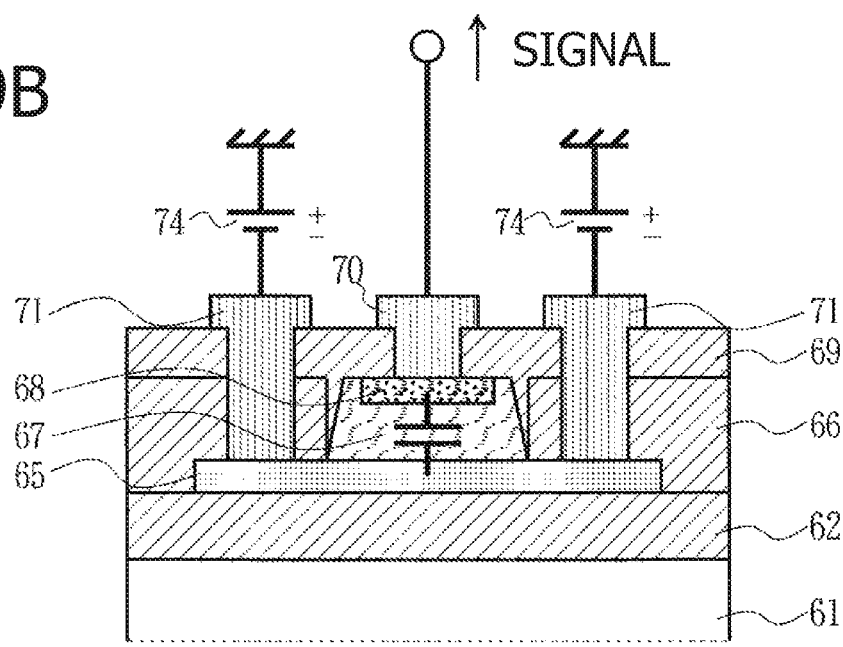
Figure 20A:
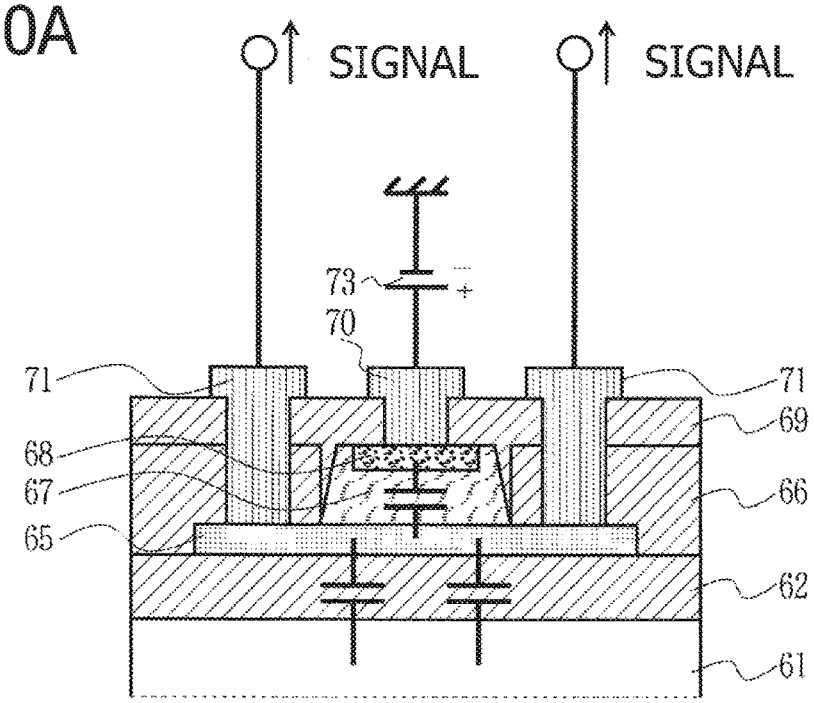
FIGS. 20A and 20B are diagrams illustrating another connection method between a conventional waveguide type, Ge-pin type light receiving device and an electronic circuit.
Figure 20B:
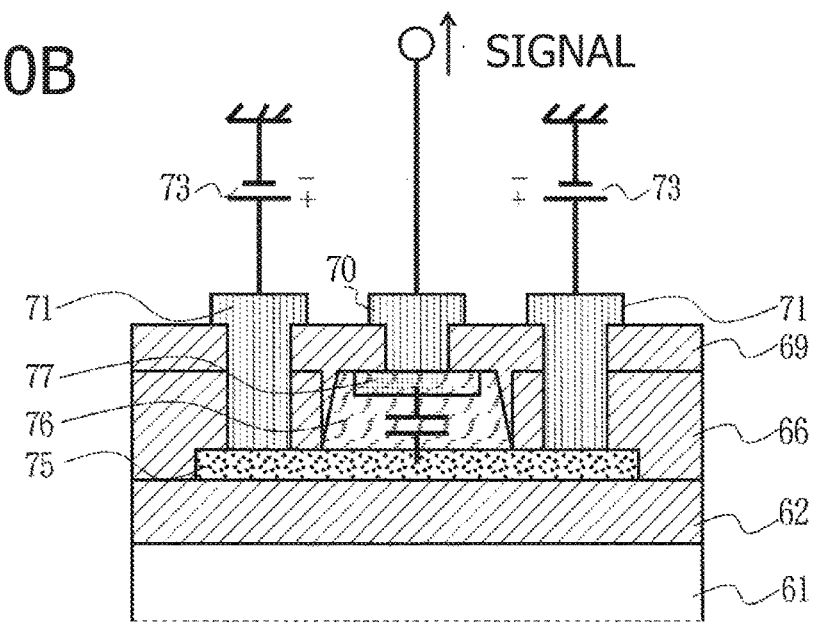

Next, the semiconductor light receiving device according to Example 7 of the present invention is described in reference to FIGS. 16 and 17. The basic manufacturing process in Example 7 is the same as that in Example 1, and therefore, only the final structure is described. FIG. 16 is a perspective diagram illustrating the semiconductor light receiving device according to Example 7 of the present invention, where two Si fine line waveguides 44 and 45 are provided on a single crystal silicon substrate 21 with a BOX layer 22 in between, and at the same time, a light receiving unit is provided between the two Si fine line waveguides 44 and 45. The light receiving unit is formed of two mesa structures made of a p type Si layer 29 and an i type Ge layer 32 and an n type Ge layer 35 that are provided on top of the p type Si layer 29. The Si fine line waveguide 44 is connected to one mesa structure, and the Si fine line waveguide 45 is connected to the other mesa structure. Here, a tapered waveguide as in FIG. 18A may intervene between the mesa structure and the Si fine line waveguide 44 and between the mesa structure and the Si fine line waveguide 45.

In this case as well, a p side electrode 38 is provided so as to make contact with the p type Si layer between each pair of mesa structures, and at the same time, n side electrodes 37 are provided so as to make contact with the n type Ge layer 35. Though not shown, a positive bias power supply is connected to the n side electrodes 37, and a signal line is connected to the p side electrodes 38.

Light that propagates through the Si fine line waveguide 44 is led to the i type Ge layer 32 in the mesa structure on the left side in the figure through the evanescent optical coupling and is absorbed so as to generate photocarriers. Meanwhile, light that propagates through the Si fine line waveguide 45 is led to the i type Ge layer 32 in the mesa structurese on the right side in the figure through the evanescent optical coupling and is absorbed so as to generate photocarriers. At this time, the photocarriers are generated at the same time in the left and right mesa structures. A reverse bias is applied to this pin structure by a positive bias power supply, and therefore, the photocarriers are drawn out so that the pin structure operates as a single bidirectional entering type photodiode 50.

Next, an application of the semiconductor light receiving device according to Example 7 of the present invention is described in reference to FIG. 17. FIG. 17 is a diagram illustrating the configuration of a demultiplexer using the semiconductor light receiving device according to Example 7 of the present invention, where an example of demultiplexing into three wavelengths is shown. A polarization splitter 52, which divides wavelength multiplexed light that has been inputted from the input waveguide 51 into TE signal light and TM signal light depending on the polarization plane, is connected to the input waveguide 51 made of an Si fine line waveguide. A loop waveguide 53 made of an Si fine line waveguide through which TE signal light and TM signal light propagate in the directions opposite to each other is connected to the output end of the polarization splitter 52, and a polarization rotator 54 is connected to the loop waveguide 53. Here, the polarization splitter 52 is a directional coupler type polarization splitter made of an Si fine line waveguide, and the polarization rotator 54 is an eccentric double core type polarization rotator made of an Si fine line waveguide.

In addition, a number of ring waveguides $55_1$ through $55_3$, each made of an Si fine line waveguide having a different optical path length, that form an add-drop type ring resonator array are optically coupled to the loop waveguide 53. Furthermore, output waveguides $56_1$ through $56_3$, each made of an Si fine line waveguide having two output ports, are optically coupled to the ring waveguides $55_1$ through $55_3$, respectively, on the drop port side.

In this case, the radius of curvature R of the ring waveguides $55_1$ through $55_3$ is optimized so as to control the demultiplexed wavelength, and thus, this add-drop type ring resonator array becomes a demultiplexer. Bidirectional entering type photodiodes $50_1$ through $50_3$ are respectively connected to the output waveguides $56_1$ through $56_3$ that extend from these two output ports in such a manner that the optical distances are equal between the polarization splitter 52 and one mesa structure in the pair in each bidirectional entering type photodiodes $50_1$ through $50_3$, and between the polarization splitter 52 and the other mesa structure in the pair.

A WDM light signal that has been inputted into the input waveguide 51 is divided into a TM light signal and a TE light signal depending on the polarization plane by the polarization splitter 52, and then the signals propagate through the loop waveguide 52 in the direction opposite to each other. The TM light signal is converted to a TE* light signal of which the polarization plane has been rotated by 90° by the polarization rotator 54. The TE light signal and the TE* light signal that propagate through the loop waveguide 53 are demultiplexed into the respective wavelengths (λ1 through λ3) by the ring waveguides $55_1$ through $55_3$ that form add-drop type ring resonators.

Light signals that have been demultiplexed into the respective wavelengths are inputted into bidirectional entering type photodiodes $50_1$ through $50_3$ as a TE light signal or a TE* optical signal in the same polarization state and are outputted as the sum of the currents that flow from the two mesa structures in the pair. In addition, light that has leaked out from the terminal of each bidirectional entering type photodiode $50_1$ through $50_3$ on the side opposite to the entering plane does not go through any of the output waveguides $56_1$ through $56_3$ in the opposite direction or enter into the loop waveguide 53 via a ring resonator, and therefore, excess noise generated by the leaked light can be suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor light receiving device, comprising:
   a substrate;
   a semiconductor fine line waveguide provided on the substrate; and
   a light receiving circuit configured to be provided on the substrate and absorb light propagating through the semiconductor fine line waveguide, wherein
   the light receiving circuit includes: a p type first semiconductor layer; a number of second semiconductor mesa structures provided on the p type first semiconductor layer in such a manner that an n type second semiconductor layer is provided on top of an i type second semiconductor layer; a p side electrode connected to the p type first semiconductor layer in a location between the second semiconductor mesa structures; and an n side electrode connected to the n type second semiconductor layer,
   the refractive index and the optical absorption coefficient of the second semiconductor layers are greater than the refractive index and the optical absorption coefficient of the first semiconductor layer, a positive bias power supply is connected to the n side electrode, and a signal line is connected to the p side electrode.

2. The semiconductor light receiving device according to claim 1, wherein the first semiconductor layer is an Si layer, and the second semiconductor layers are made of either $Si_xGe_{1-x}$ (where $0 \leq x \leq 0.5$) or $Ge_{1-x}Sn_x$ (where $0 \leq x \leq 0.1$).

3. The semiconductor light receiving device according to claim 1 further comprising between the semiconductor fine line waveguide and the light receiving circuit an optical branching circuit configured to branch either light that propagates through the semiconductor fine line waveguide or the intensity peak location of light into the same number as that of the second semiconductor mesa structures.

4. The semiconductor light receiving device according to claim 3, wherein the optical branching circuit is a multi-mode interferometer coupler.

5. The semiconductor light receiving device according to claim 4, wherein the p type first semiconductor layer provides a part of the multi-mode interferometer coupler.

6. The semiconductor light receiving device according to claim 3, wherein the optical branching circuit is a directional coupler.

7. The semiconductor light receiving device according to claim 3, wherein the optical branching circuit is a branching waveguide.

8. The semiconductor light receiving device according to claim 1, wherein the number of the second semiconductor mesa structures is three.

9. The semiconductor light receiving device according to claim 1, wherein the number of the second semiconductor mesa structures is two, and the semiconductor fine line waveguide includes: a first semiconductor fine line waveguide from which light enters into one of the second semiconductor mesa structures from the first direction; and a second semiconductor fine line waveguide from which light enters into the other of the second semiconductor mesa structures from a second direction opposite to the first direction.

10. The semiconductor light receiving device according to claim 1, wherein the substrate is a single crystal semiconductor substrate where a buried insulator layer is provided on a surface.

* * * * *

UNITED STATES PATENT AND TRADEMARK OFFICE
CERTIFICATE OF CORRECTION

| | |
|---|---|
| PATENT NO. | : 9,735,296 B2 |
| APPLICATION NO. | : 15/284920 |
| DATED | : August 15, 2017 |
| INVENTOR(S) | : Takasi Simoyama |

It is certified that error appears in the above-identified patent and that said Letters Patent is hereby corrected as shown below:

On the Title Page

Item (73) "PHOTONICS ELECTRONICS TECHNOLOGY RESEARCH ASSOCIATES" should read --PHOTONICS ELECTRONICS TECHNOLOGY RESEARCH ASSOCIATION--.

Signed and Sealed this
Third Day of October, 2017

Joseph Matal
*Performing the Functions and Duties of the*
*Under Secretary of Commerce for Intellectual Property and*
*Director of the United States Patent and Trademark Office*